(12) United States Patent
Cheng

(10) Patent No.: US 9,021,413 B2
(45) Date of Patent: Apr. 28, 2015

(54) DEVICE MATCHING LAYOUT AND METHOD FOR IC

(71) Applicant: Silergy Semiconductor Technology (Hangzhou) Ltd, Hangzhou, ZheJiang Province (CN)

(72) Inventor: Shuai Cheng, Hangzhou (CN)

(73) Assignee: Silergy Semiconductor Technology (Hangzhou) Ltd., Hangzhou (CN)

( * ) Notice: Subject to any disclaimer, the term of this patent is extended or adjusted under 35 U.S.C. 154(b) by 357 days.

(21) Appl. No.: 13/633,267

(22) Filed: Oct. 2, 2012

(65) Prior Publication Data

US 2013/0105938 A1    May 2, 2013

(30) Foreign Application Priority Data

Nov. 1, 2011  (CN) .......................... 2011 1 0339650

(51) Int. Cl.
*G06F 17/50*    (2006.01)
*H01L 27/08*    (2006.01)
*H01L 27/02*    (2006.01)

(52) U.S. Cl.
CPC ........ *H01L 27/0802* (2013.01); *H01L 27/0207* (2013.01); *G06F 17/5045* (2013.01)

(58) Field of Classification Search
CPC ............ H01L 27/0207; G06F 17/5068; G06F 17/5072
USPC .......................................... 716/119; 257/528
See application file for complete search history.

(56) References Cited

U.S. PATENT DOCUMENTS

| 7,253,012 B2 * | 8/2007 | Kerr et al. ........................ 438/22 |
| 2009/0235219 A1 * | 9/2009 | Lin et al. ............................ 716/9 |
| 2010/0127782 A1 * | 5/2010 | Karp .............................. 330/298 |

* cited by examiner

*Primary Examiner* — Jack Chiang
*Assistant Examiner* — Brandon Bowers
(74) *Attorney, Agent, or Firm* — Michael C. Stephens, Jr.

(57) ABSTRACT

The present invention relates to device matching in an integrated circuit. In one embodiment, an integrated circuit of matched devices can include: N main-devices to be matched by 4×K sub-devices configured to form K device arrays, where each of the device arrays includes four sub-device groups arrayed symmetrically around a vertical axis and a horizontal axis, where each of the sub-device groups includes N sub-devices arrayed with equal distance along a direction of the vertical axis, where K and N are integers, and N is larger than two; metal lead wires arrayed in parallel and with equal distance, and configured to connect the main-devices; a common connecting wire configured to connect common nodes of the sub-devices together; and where four sub-devices arrayed in the four sub-device groups, and other sub-devices arrayed in other sub-device groups, are coupled to form 4×K sub-devices to match the main-devices.

14 Claims, 9 Drawing Sheets

US 9,021,413 B2

DEVICE MATCHING LAYOUT AND METHOD FOR IC

RELATED APPLICATIONS

This application claims the benefit of Chinese Patent Application No. 201110339650.5, filed on Nov. 1, 2011, which is incorporated herein by reference in its entirety.

FIELD OF THE INVENTION

The present invention relates to the field of integrated circuit design, and more specifically to device matching layouts and methods for integrated circuits.

BACKGROUND

In layout design of device structures in integrated circuits, device matching is becoming an increasingly important issue. Matching of individual devices (e.g., transistors) is particularly important in analog circuit design where device ratios are utilized in many circuits, such as current mirrors. Some common techniques that may improve device matching are multi-gate finger layout and common-centroid layout. Multi-gate finger layout typically implements a wide transistor as several smaller transistors in parallel. Common-centroid layout involves a set of devices having a common center point, and this may be used to minimize effects of linear process gradients, such as oxide thicknesses.

SUMMARY

In one embodiment, an integrated circuit of matched devices, can include: (i) N main-devices to be matched by 4×K sub-devices, the sub-devices being configured to form K device arrays, where each of the device arrays includes four sub-device groups arrayed symmetrically around a vertical axis and a horizontal axis, where each of the sub-device groups includes N sub-devices arrayed with equal distance along a direction of the vertical axis, where K and N are integers, and N is larger than two; (ii) metal lead wires arrayed in parallel and with equal distance, where the metal lead wires are configured to connect the main-devices; (iii) a common connecting wire configured to connect common nodes of the sub-devices together; and (iv) where four sub-devices arrayed in the four sub-device groups, and other sub-devices arrayed in other sub-device groups, are coupled in series or in parallel to form 4×K sub-devices to match the main-devices, and where the sub-devices are configured to be connected to a peripheral circuit though the metal lead wires.

In one embodiment, a layout method for an integrated circuit of matched devices, can include: (i) forming N main-devices by 4×K sub-devices, where N and K are both integers, and N is greater than two; (ii) setting N parallel metal lead wires with equal distance; (iii) arranging the N sub-devices with equal distance along a direction of the vertical axis on one side of the N parallel metal lead wires to obtain a first sub-device group; (iv) obtaining a first device array by reflecting the first sub-device group about the vertical axis and the horizontal axis; (v) obtaining K device arrays by reflecting the first device array along the horizontal axis; (vi) connecting four sub-devices which are symmetrical about the vertical axis and the horizontal axis in the first device array with the sub-devices in other device arrays in parallel or in series to form the main-device, where a total number of the sub-devices is 4×K; (vii) connecting the sub-devices to the periph-eral circuit through corresponding the metal lead wires; and (viii) connecting common nodes of the sub-devices through a common connecting wire.

Embodiments of the present invention can advantageously provide several advantages over conventional approaches. For example, the integrated circuit can achieve a common-centroid layout, and may reduce the influence of doping concentration gradients, heat distribution gradients, stress gradients, and other factors. In addition, the sub-devices used to form the main-devices can be connected to peripheral circuitry through metal lead wires to facilitate layout, as well as to decrease production costs of integrated circuits with matched devices. Other advantages of the present invention may become readily apparent from the detailed description of preferred embodiments below.

DETAILED DESCRIPTION

Figure 1:
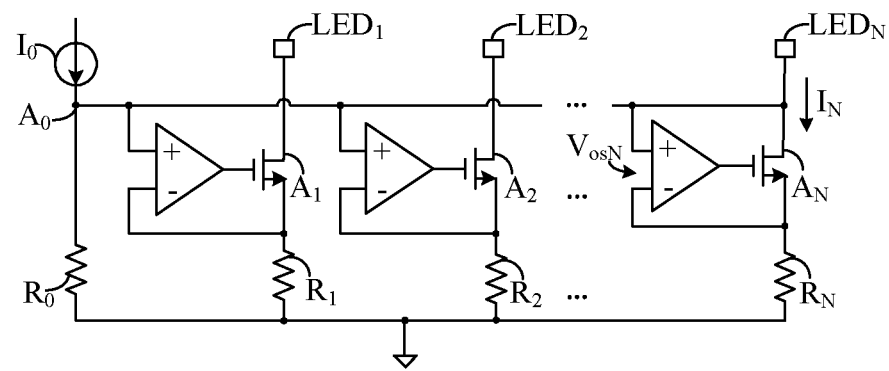
FIG. 1 is a block diagram of an example multi-channel light-emitting diode (LED) driver that benefits from precise device matching.

Reference may now be made in detail to particular embodiments of the invention, examples of which are illustrated in the accompanying drawings. While the invention may be described in conjunction with the preferred embodiments, it may be understood that they are not intended to limit the invention to these embodiments. On the contrary, the invention is intended to cover alternatives, modifications and equivalents that may be included within the spirit and scope of the invention as defined by the appended claims. Furthermore, in the following detailed description of the present invention, numerous specific details are set fourth in order to provide a thorough understanding of the present invention. However, it may be readily apparent to one skilled in the art that the present invention may be practiced without these specific details. In other instances, well-known methods, procedures, processes, components, structures, and circuits have not been described in detail so as not to unnecessarily obscure aspects of the present invention.

Some portions of the detailed descriptions which follow are presented in terms of processes, procedures, logic blocks, functional blocks, processing, schematic symbols, and/or other symbolic representations of operations on data streams, signals, or waveforms within a computer, processor, controller, device and/or memory. These descriptions and representations are generally used by those skilled in the data processing arts to actively convey the substance of their work to others skilled in the art. Usually, though not necessarily, quantities being manipulated take the form of electrical, magnetic, optical, or quantum signals capable of being stored, transferred, combined, compared, and otherwise manipulated in a computer or data processing system. It has proven convenient at times, principally for reasons of common usage, to refer to these signals as bits, waves, waveforms, streams, values, elements, symbols, characters, terms, numbers, or the like.

Furthermore, in the context of this application, the terms "wire," "wiring," "line," "signal," "conductor," and "bus" refer to any known structure, construction, arrangement, technique, method and/or process for physically transferring a signal from one point in a circuit to another. Also, unless indicated otherwise from the context of its use herein, the terms "known," "fixed," "given," "certain" and "predetermined" generally refer to a value, quantity, parameter, constraint, condition, state, process, procedure, method, practice, or combination thereof that is, in theory, variable, but is typically set in advance and not varied thereafter when in use.

Embodiments of the present invention can advantageously provide several advantages over conventional approaches. For example, the integrated circuit can achieve a common-centroid layout, and may reduce the influence of doping concentration gradients, heat distribution gradients, stress gradients, and other factors. In addition, the sub-devices used to form the main-devices can be connected to peripheral circuitry through metal lead wires to facilitate layout, as well as to decrease production costs of integrated circuits with matched devices. The invention, in its various aspects, may be explained in greater detail below with regard to exemplary embodiments.

With reference to FIG. 1, an example multi-channel light-emitting diode (LED) driver that can benefit precise device matching is shown. In FIG. 1, current matching between each channel may be critical. The current flows through each LED channel can be obtained according to equation (1):

$$I_{LEDN} = \frac{I_0 \cdot R_0 + V_{osN}}{R_N} \qquad (1)$$

Here, current $I_0$ may be set by users, $I_{LEDN}$ can denote the current flowing through the $N_{th}$ LED channel, and $V_{osN}$ may denote the input offset voltage existing at the input terminals of the $N_{th}$ amplifier. From equation (1), it can be seen that in order to get precise current matching between each LED channel, not only input offset voltage $V_{osN}$ but also main-resistors $R_0, R_1, R_2 \ldots R_N$ should be precisely matched.

Figure 2:
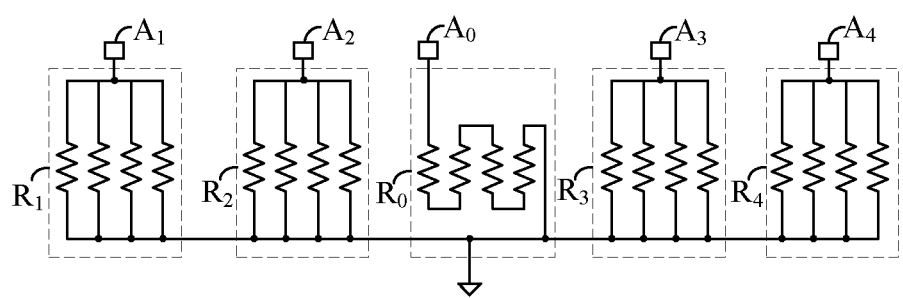
FIG. 2 is a schematic diagram of an example resistor matching approach.

FIG. 2 shows an example matching approach for main-resistors $R_0, R_1, R_2 \ldots R_N$. Taking N=4 as an example, main-resistors $R_0, R_1, R_2, R_3$ and $R_4$ may be divided into four sub-resistors, where main-resistors $R_1, R_2, R_3$ and $R_4$ may be divided into four parallel connected sub-resistors, while main-resistor $R_0$ may be divided into four series connected sub-resistors, and all the sub-resistors may be arrayed closely along the same direction. However, main-resistors $R_0, R_1, R_2 \ldots R_N$ may not be able to achieve a common-centroid layout with this approach due to the different lithography environment and variation of doping concentration gradients, heat distribution gradients, stress gradients, and other factors. Thus, precise device matching may not be realized using this approach.

The integrated circuits of matched devices according to the embodiments of the present invention can include N devices, N metal lead wires, and a common connecting wire. In one embodiment, an integrated circuit of matched devices, can include: (i) N main-devices to be matched by 4×K sub-devices, the sub-devices being configured to form K device arrays, where each of the device arrays includes four sub-device groups arrayed symmetrically around a vertical axis and a horizontal axis, where each of the sub-device groups includes N sub-devices arrayed with equal distance along a direction of the vertical axis, where K and N are integers, and N is larger than two; (ii) metal lead wires arrayed in parallel and with equal distance, where the metal lead wires are configured to connect the main-devices; (iii) a common connecting wire configured to connect common nodes of the sub-devices together; and (iv) where four sub-devices arrayed in the four sub-device groups, and other sub-devices arrayed in other sub-device groups, are coupled in series or in parallel to form 4×K sub-devices to match the main-devices, and where the sub-devices are configured to be connected to a peripheral circuit though the metal lead wires.

Figure 3:
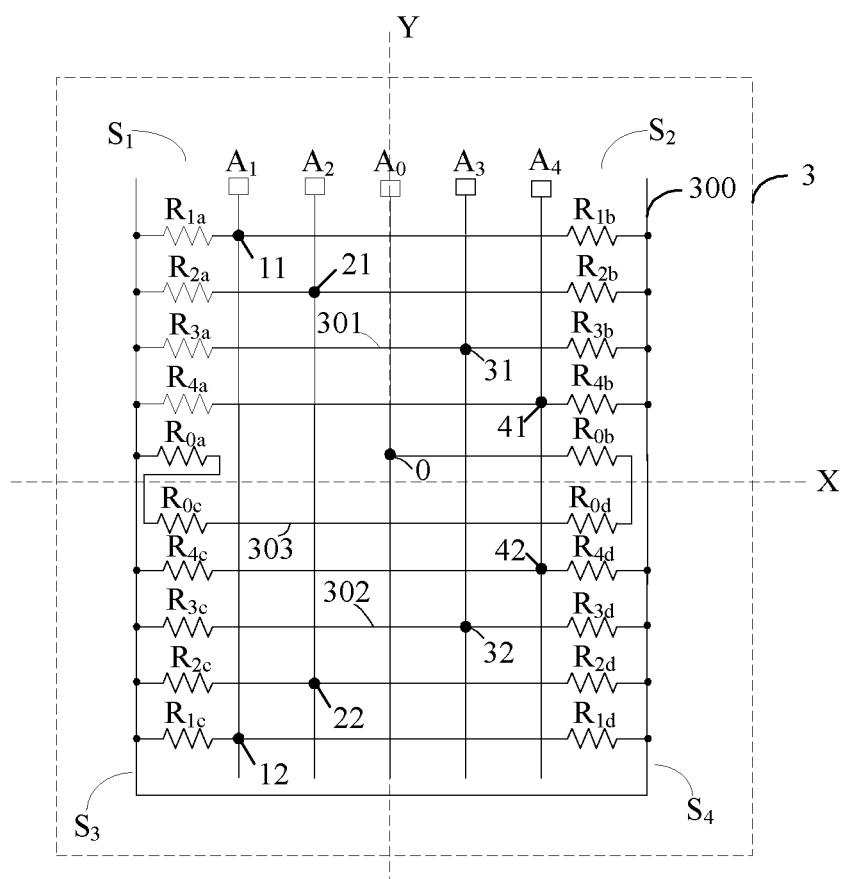
FIG. 3 is a structural diagram of a first example integrated circuit of matched devices in accordance with embodiments of the present invention.

With reference to FIG. 3, shown is a structure diagram of a first example integrated circuit of matched devices for the multi-channel LED driver shown in FIG. 1. In this example, the N devices to be matched can be five main-resistors $R_0, R_1, R_2, R_3$ and $R_4$, and N metal lead wires arrayed in parallel and with equal distance can be $A_1, A_2, A_0, A_3$ and $A_4$. Each of the five main-resistors $R_0, R_1, R_2, R_3$ and $R_4$ can be divided into four sub-resistors, where the number of sub-resistors can be derived from 4×K, when K denotes the number of device arrays. In this example, the sub-resistors can used to form a first device array 3 in assumption of K=1.

The first device array 3 can include: (i) four sub-device groups $S_1, S_2, S_3$ and $S_4$ arrayed symmetrically about vertical axis Y and horizontal axis X, where each sub-device group can include five vertically oriented sub-resistors, the distances between every two sub-resistors being equal; (ii) metal connecting wires; (iii) connecting holes or vias used to connect sub-resistors in parallel or in series together with metal connecting wires; (iv) five metal lead wires $A_1, A_2, A_0, A_3$ and $A_4$ used to connect sub-resistors with peripheral circuit; and (v) common connecting wire 300, which can be used to connect the sub-resistors at common nodes.

In this example, first sub-device group $S_1$ can include five sub-resistors $R_{1a}, R_{2a}, R_{3a}, R_{4a}$ and $R_{0a}$, second sub-device group $S_2$ can include five sub-resistors $R_{1b}, R_{2b}, R_{3b}, R_{4b}$ and $R_{0b}$, third sub-device group $S_3$ can include five sub-resistors $R_{1c}, R_{2c}, R_{3c}, R_{4c}$ and $R_{0c}$, and fourth sub-device group $S_4$ can include five sub-resistors $R_{1d}, R_{2d}, R_{3d}, R_{4d}$ and $R_{0d}$.

Every four sub-resistors may be symmetrically arrayed about vertical axis Y and horizontal axis X, and can be connected in parallel or in series through metal connecting wires and connecting holes to form one main-resistor. As shown in FIG. 3, sub-resistor $R_{3a}$ may be connected with sub-resistor $R_{3b}$ through metal connecting wire 301, and sub-resistor $R_{3c}$ may be connected with sub-resistor $R_{3d}$ through metal connecting wire 302. Four sub-resistors $R_{3a}, R_{3b}, R_{3c}$ and $R_{3d}$ can therefore be connected in parallel by via 31 at a common node of metal connecting wire 301 and metal lead wire $A_3$, and via 32 at a common node of metal connecting wire 302 and metal lead wire $A_3$.

In the same way, four sub-resistors $R_{1a}, R_{1b}, R_{1c}$ and $R_{1d}$ can be connected in parallel through two metal connecting wires, and by vias 11 and 12 at common nodes of the two metal connecting wires and metal lead wire $A_1$. Four sub-resistors $R_{2a}$, $R_{2b}$, $R_{2c}$ and $R_{2d}$ can be connected in parallel through two metal connecting wires, and by vias 21 and 22 at common nodes of the two metal connecting wires and metal lead wire $A_2$. Four sub-resistors $R_{4a}$, $R_{4b}$, $R_{4c}$ and $R_{4d}$ can be connected in parallel through two metal connecting wires, and by vias 41 and 42 at common nodes of the two metal connecting wires and metal lead wire $A_4$.

Different from the above description, sub-resistors $R_{0a}$, $R_{0b}$, $R_{0c}$ and $R_{0d}$ can be connected in series through metal connecting wire 303. In this way, four sub-resistors $R_{1a}$, $R_{1b}$, $R_{1c}$ and $R_{1d}$ can be connected in parallel to form main-resistor $R_1$. Four sub-resistors $R_{2a}$, $R_{2b}$, $R_{2c}$ and $R_{2d}$ can be connected in parallel to form main-resistor $R_2$, four sub-resistors $R_{3a}$, $R_{3b}$, $R_{3c}$ and $R_{3d}$ can be connected in parallel to form main-resistor $R_3$, and four sub-resistors $R_{4a}$, $R_{4b}$, $R_{4c}$ and $R_{4d}$ can be connected in parallel to form resistor $R_4$, while four sub-resistors $R_{0a}$, $R_{0b}$, $R_{0c}$ and $R_{0d}$ can be connected in series to form resistor $R_0$.

The main-resistors formed by the sub-resistors can be connected to peripheral circuit through metal lead wires $A_1$, $A_2$, $A_0$, $A_3$ and $A_4$. In this example, the metal connecting wires and the metal lead wires can be in two different levels. From the above description, it can be concluded that main-resistors $R_1$, $R_2$, $R_3$ and $R_4$ may be formed of four parallel connected sub-resistors, while main-resistor $R_0$ may be formed of four series connected sub-resistors.

The relationship of current $I_N$ flowing through resistor $R_N$ and current $I_o$ flowing through resistor $R_o$ in the LED driver as shown in FIG. 1 can be derived in equation (2) by applying the first example integrated circuit:

$$\frac{I_N}{I_o} = \frac{R_o}{R_N} = \frac{4 \times R'}{R'/4} = 16 \qquad (2)$$

R can denote the value of a sub-resistor. It can be seen from equation (2) that the proportion of current $I_N$ and current $I_o$ can be changed by adjusting a number of parallel connected sub-resistors and a number of series connected sub-resistors.

Also, the common-centroid layout of main-resistors $R_0$, $R_1$, $R_2$, $R_3$ and $R_4$ can be achieved in FIG. 3 to realize precise resistor matching and avoid influences of doping concentration gradients, heat distribution gradients, stress gradients, and other factors. Further, as is apparent to one skilled in the art, the order of metal lead wires with respect to the order of sub-resistors in the above example can be changed to be in any suitable order, and is not limited to that shown by the particular example of FIG. 3.

In addition, when K is an integer larger than 1, the remaining device arrays can be obtained by reflecting symmetrical configurations from the first device array 3 along a direction of horizontal axis X.

The integrated circuit of matched devices in this example can achieve a common-centroid layout by dividing the main-devices into several sub-devices, where the sub-devices arrayed in four sub-device groups can be connected in parallel or in series through metal connecting wires and/or metal lead lines, and connecting vias/holes. In this way, influences of doping concentration gradients, heat distribution gradients, stress gradients, and other factors, can be decreased to overcome disadvantages of traditional integrated circuit. Further, the main-devices can be connected to peripheral circuitry through metal lead wires to facilitate layout, as well as to decrease associated integrated circuit production costs.

Figure 4:
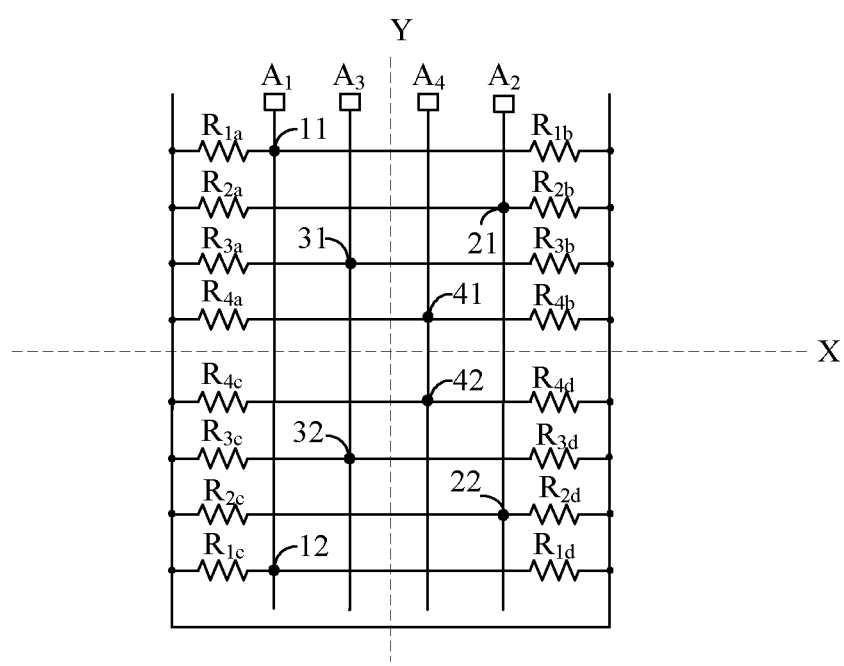
FIG. 4 is a structural diagram of a second example integrated circuit of matched devices in accordance with embodiments of the present invention.

With reference to FIG. 4, shown is a structure diagram of a second example integrated circuit of matched devices in accordance with the embodiments of the present invention. This example can include four main-resistors, and each of the four main-resistors can be formed by four sub-resistors. Different from the first example shown in FIG. 3, in this particular example, every four sub-resistors may be connected in parallel. The metal lead wires can be arranged from both sides to center on the left and right alternately according to an order of four sub-resistors in a same sub-resistor group. For example, if the order of the four sub-resistors is $R_{1a}$, $R_{1b}$, $R_{1c}$ and $R_{1d}$, then the order of metal lead wires can be $A_1$, $A_3$, $A_4$ and $A_2$.

In this example, connecting holes 11, 12, 21, 22, 31, 32, 41 and 42 can achieve a substantial common-centroid layout, and therefore make the parasitic resistors of metal wires match each other and further improve precise device matching. According to this example, when the devices to be matched are more than one, the rules for arranging the sub-devices in the same sub-device group from top to bottom and for arranging the metal lead wires alternately on the left and right are the same as in FIG. 4. However, the orders of sub-devices and of metal lead wires may not be limited. The order of metal lead wires and the order of sub-devices should be consistent with the rules.

Figure 5:
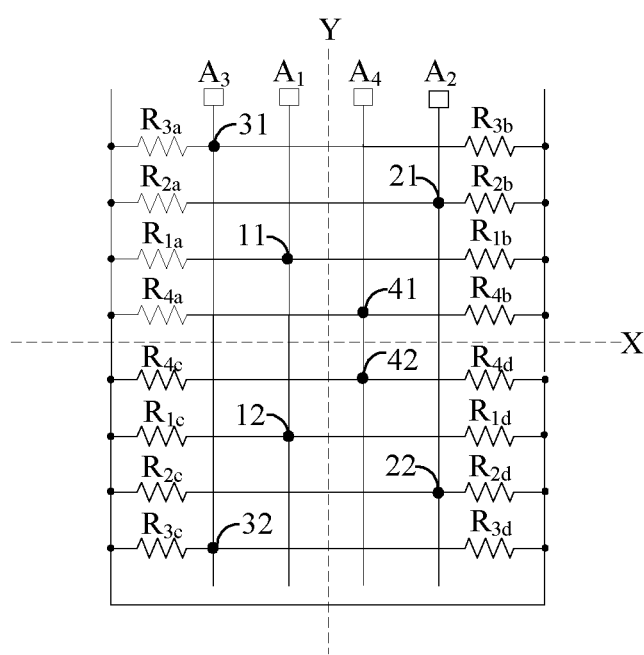
FIG. 5 is a structural diagram of a third example integrated circuit of matched devices in accordance with embodiments of the present invention.

For example, FIG. 5 shows a third example integrated circuit of matched devices in accordance with the embodiments of the present invention. Here, the order of sub-devices in the first sub-device group is $R_{3a}$, $R_{2a}$, $R_{1a}$ and $R_{4a}$, and the corresponding order of metal lead wires should be $A_3$, $A_1$, $A_4$ and $A_2$.

Figure 6:
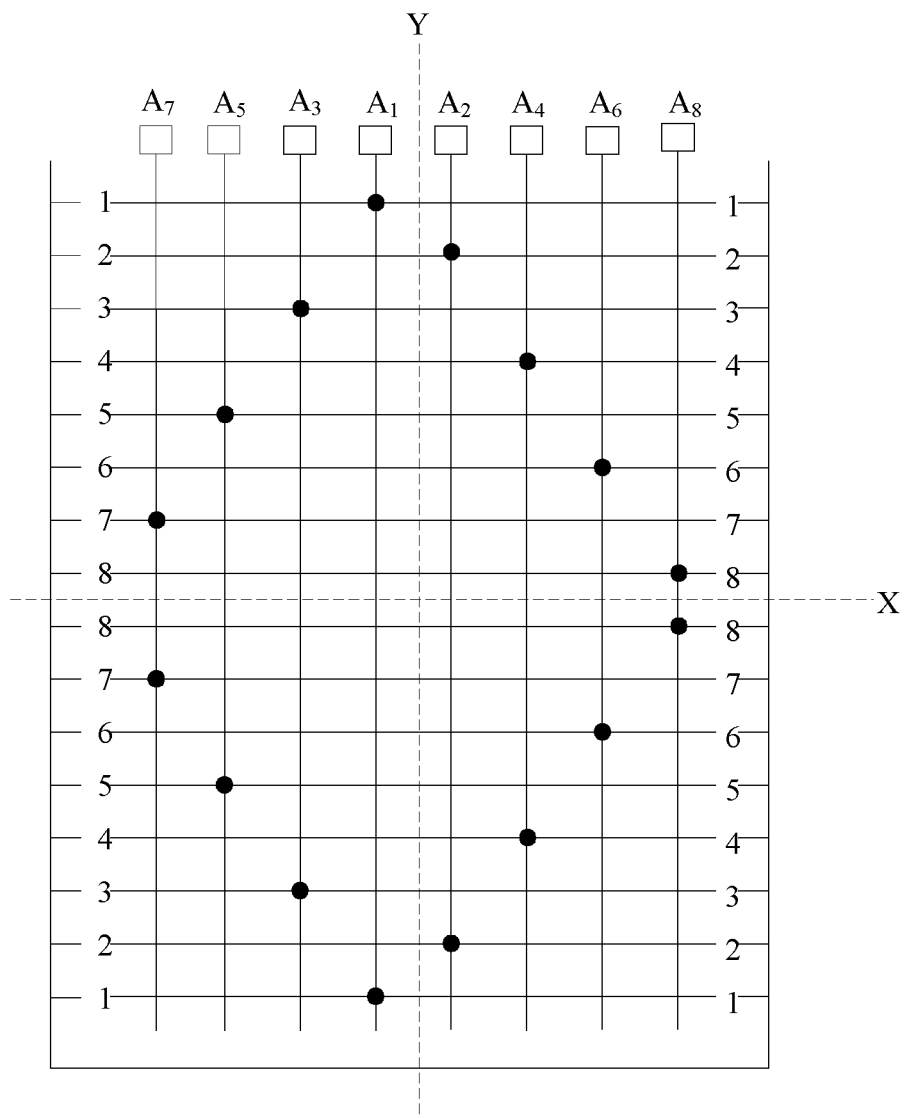
FIG. 6 is a structural diagram of a fourth example integrated circuit of matched devices in accordance with embodiments of the present invention.

With reference to FIG. 6, shown is a structure diagram of a fourth example integrated circuit of matched devices in accordance with the embodiments of the present invention. In this example, a number of main-devices to be matched is eight (N=8), and each of the main-devices can be formed by four parallel connected sub-devices. Taking K=1 as an example to explain the structure diagram in detail, the sub-devices for forming a same main-device may be denoted by the same number, and may be connected to peripheral circuit through the corresponding metal lead wires. For example, number 1 may denote the sub-devices used for forming the first main-device, and its corresponding metal lead wire is $A_1$.

As shown in FIG. 6, the integrated circuit of matched devices can include one device array, where every four sub-devices located in four sub-device groups and symmetrically around horizontal axis X and vertical axis Y can be connected in parallel to form one corresponding main-device. Different from the examples shown in FIG. 3, FIG. 4 and FIG. 5, the metal lead wires in this example can be arranged from center to both sides on the left and right alternately according to the order of eight sub-resistors in the same sub-resistor group. It can be seen from FIG. 6 that the order of the sub-devices in the first sub-device group from top to bottom is 1, 2, 3, 4, 5, 6, 7 and 8, and the order of the metal lead wires from left to right can be $A_7$, $A_5$, $A_3$, $A_1$, $A_2$, $A_4$, $A_6$ and $A_8$. The sub-devices can be connected in the same way as shown in FIG. 3, and substantial common-centroid layout can also be achieved to improve the precise matching of devices.

As one skilled in the art will recognize, when the number of main-devices is changed, the orders of sub-devices and of metal lead wires may not be limited. The order of sub-devices and the order of metal lead wires may be arrayed according to the same rule as shown in FIG. 6. Further, when the number of device arrays is larger than one, the rest device arrays can be obtained by reflecting and/or repeating the first device array along horizontal axis X.

For example, when a number of sub-devices for forming one main-device is eight, that means the number of device arrays is two (K=2), and the other device array can be obtained by reflect once from the first device array. When the number of sub-devices for forming one main-device is twelve, that means the number of device arrays is three (K=3), and other two device arrays can be obtained by reflect twice from the first device array. The sub-devices for forming one main-device can be connected in parallel or in series.

Figure 7:
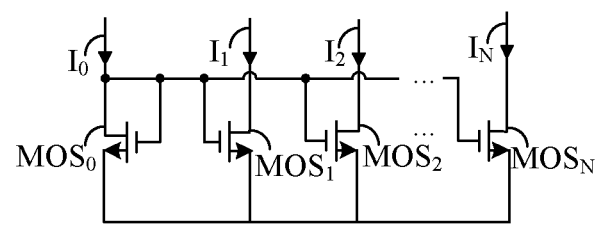
FIG. 7 is a block diagram of an example current mirror circuit formed by plurality of MOS transistors.

In addition, the main-devices to be matched in particular embodiments can be passive components (e.g., resistors, capacitors, inductors, etc.), or active components (e.g., diodes, transistors, field effect transistors, etc.). With reference to FIG. 7, shown is a schematic diagram of an example current mirror formed of plurality of MOS transistors.

Figure 8:
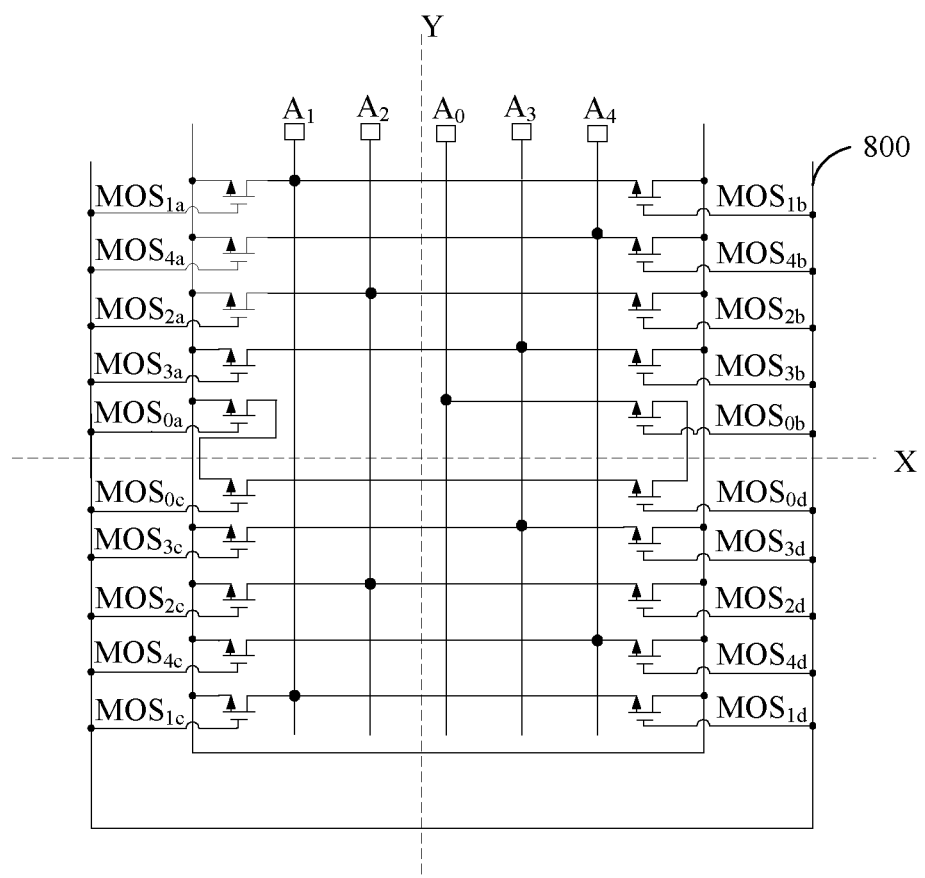
FIG. 8 is a structural diagram of a fifth example integrated circuit of matched devices in accordance with embodiments of the present invention.

With reference to FIG. 8, shown is a structure diagram of a fifth example integrated circuit of matched devices in accordance with embodiments of the present invention. This example can include a plurality of main-MOS transistors to be matched. Each of the main-MOS transistors can be formed by a plurality of sub-MOS transistors. The drains and sources of the sub-MOS transistors can be connected in the same way as the sub-resistors shown in the former examples, and the gates of the sub-MOS transistors can be connected together through metal connecting wire 800.

Suppose $MOS_1$, $MOS_2$, ... $MOS_N$ are all formed by 4×K parallel connected sub-MOS transistors, and $MOS_0$ is formed by m series connected sub-MOS transistors, then a proportion of the current flowing through $MOS_N$ and the current flowing through $MOS_0$ which equals to the width-length ratio, is shown in equation (3):

$$\frac{I_{MOSN}}{I_{MOS0}} = \frac{w/L \cdot 4k}{\frac{w/L}{m}} = 4mk \qquad (3)$$

In this equation, w/L may denote the width-length ratio of a sub-MOS transistor. In FIG. 8, each of the main-MOS transistors can be formed by four sub-MOS transistors. That is, m=4, when K=1, and the layout for matching sub-MOS transistors may be substantially the same as for matching sub-resistors, as described above. A difference is that the gates of sub-MOS transistors may be connected together through metal lead wire 800.

It can be seen from equation (3) that the proportion of the current flowing through $MOS_N$ and the current flowing through $MOS_0$ can be altered by changing the numbers of sub-MOS transistors for forming $MOS_N$ and/or $MOS_0$. In order to reduce dimensions of the integrated circuit of matched devices, in the practical layout process, the common connecting wire of sub-devices may be above the sub-devices, where a common connecting wire can be a metal wire in a same level with the metal lead wires, and the sub-devices can be connected to the common connecting wire through vias.

In one embodiment, a layout method for an integrated circuit of matched devices, can include: (i) forming N main-devices by 4×K sub-devices, where N and K are both integers, and N is greater than two; (ii) setting N parallel metal lead wires with equal distance; (iii) arranging the N sub-devices with equal distance along a direction of the vertical axis on one side of the N parallel metal lead wires to obtain a first sub-device group; (iv) obtaining a first device array by reflecting the first sub-device group about the vertical axis and the horizontal axis; (v) obtaining K device arrays by reflecting the first device array along the horizontal axis; (vi) connecting four sub-devices which are symmetrical about the vertical axis and the horizontal axis in the first device array with the sub-devices in other device arrays in parallel or in series to form the main-device, where a total number of the sub-devices is 4×K; (vii) connecting the sub-devices to the peripheral circuit through corresponding the metal lead wires; and (viii) connecting common nodes of the sub-devices through a common connecting wire.

Figure 9:
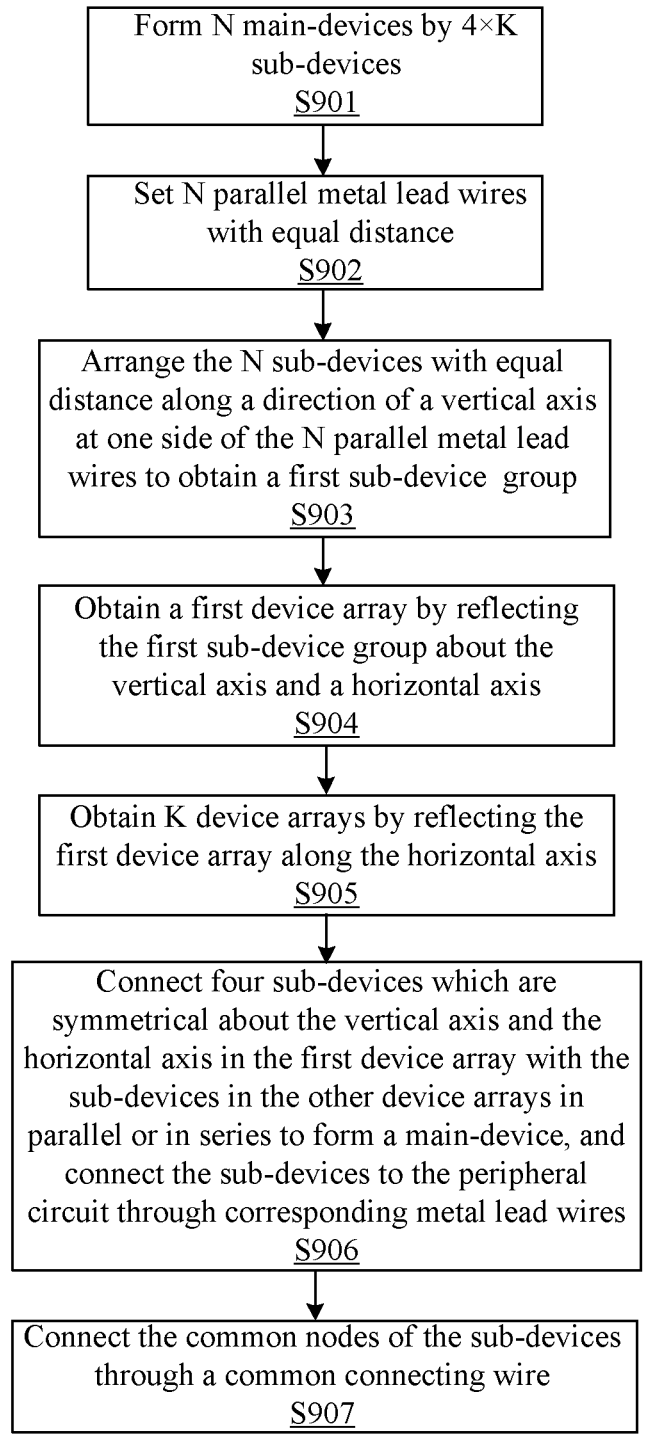
FIG. 9 is a flow diagram of an example layout method for an integrated circuit of matched devices in accordance with embodiments of the present invention.

With reference to FIG. 9, shown is a flow diagram of an example integrated circuit design method of matched devices in accordance with embodiments of the present invention. At S901, N main-devices can be formed by 4×K sub-devices, where N and K are both positive integers, and N is larger than two. At S902, N parallel metal lead wires can be set with equal distance. At S903, the N sub-devices with equal distance can be arranged along a vertical axis direction at one side of the N parallel lead wires to obtain a first sub-device group. At S904, a first device array can be obtained by reflecting the first sub-device group about the vertical axis and the horizontal axis.

At S905, K device arrays can be obtained by reflecting or otherwise replicating the first device array along the horizontal axis. At S906, four sub-devices which are symmetrical about the vertical axis and the horizontal axis can be connected in the first device array with the sub-devices in other device arrays in parallel or in series to form a main-device. The total number of sub-devices may be 4×K, and the sub-devices may connect to peripheral circuitry through corresponding metal lead wires. At S907, common nodes of the sub-devices can be connected through a common connecting wire.

In FIG. 9, step S906 can also include connecting the four sub-devices symmetrically around the vertical axis through two metal connecting wires. The metal connecting wires may be in a different level from the metal lead wires, and vias can be used for connections at the common nodes of the metal connecting wires and the corresponding metal lead wires.

Step S906 can also include connecting the four sub-devices symmetrically about the vertical axis in series through a metal connecting wire, and utilizing one or more vias at the common node of the metal connecting wire and the metal lead wire. In order to obtain a common-centroid layout and precise matching of devices, the design method can also include connecting the four sub-devices in the four sub-device groups which are symmetrical about the vertical axis and the horizontal axis in parallel, and arranging an order of the metal lead wires from both sides to center on the left and right alternately according to an order of the sub-devices in the same sub-device group.

The example design method can also include connecting the four sub-devices in the four sub-device groups which are symmetrical about the vertical axis and the horizontal axis in parallel, and arranging the order of metal lead lines from center to both sides on the left and right alternately according to the order of the sub-devices in the same sub-device group.

In order to reduce dimensions of the integrated circuit, in the practical layout process, the common connecting wire of sub-devices may be above the sub-devices, where the common connecting wire can be a metal wire in a same level as the metal lead wires, and the sub-devices can be connected to the common connecting wire through vias. The devices to be matched here can be passive components (e.g., resistors, capacitors inductors, etc.), or active components (e.g., diodes, transistors, field effect transistors, etc.).

The vertical axis and the horizontal axis directions described in the examples above are added to explain particular embodiments. As described herein, these vertical and horizontal axes, as well as levels (e.g., metal levels), and above/below descriptors, are relative terms, and are not meant to limit the invention to strictly certain directions.

The foregoing descriptions of specific embodiments of the present invention have been presented through images and text for purpose of illustration and description of the voltage controlled current source circuit and method. They are not intended to be exhaustive or to limit the invention to the precise forms disclosed, and obviously many modifications and variations are possible in light of the above teaching, such as different implementations of the differentiating circuit and enabling signal generator.

The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. An integrated circuit of matched devices, the integrated circuit comprising:
   a) N main-devices by each composed of 4×K sub-devices, wherein said sub-devices form K device arrays, wherein each of said device arrays comprises four sub-device groups arrayed symmetrically around a vertical axis and a horizontal axis, wherein each of said sub-device groups comprises N sub-devices arrayed with equal distance along a direction of said vertical axis, wherein K and N are integers, and wherein N is at least two;
   b) metal lead wires arrayed in parallel along said vertical axis and with equal distance, wherein said metal lead wires lead out said main-devices;
   c) a common connecting wire that connects common nodes of said sub-devices together; and
   d) wherein said 4×K sub-devices composed of four sub-devices of one of said device arrays is arrayed symmetrically around said vertical and horizontal axes, and other corresponding four sub-devices of remaining of said K device array, are coupled in series or in parallel to form one of said N main-devices that is configured to be connected to a peripheral circuit through said metal lead wires.

2. The integrated circuit of claim 1, wherein when said main-device is formed by 4×K parallel coupled said sub-devices, said integrated circuit further comprises metal connecting wires arrayed in a different level than said metal lead wires and along said vertical direction with said metal lead wires, wherein two terminals of said metal connecting wires are connected to two said sub-devices which are arrayed along said metal lead wires, and wherein common nodes of said metal lead wire and a corresponding said metal connecting wire are connected by a via.

3. The integrated circuit of claim 2, wherein when said main-device is formed by 4×K parallel connected said sub-devices, said metal lead wires are arrayed from center to both left and right sides alternating according to an order of said sub-devices in said sub-device group.

4. The integrated circuit of claim 2, wherein when said main-device is formed by 4×K parallel connected said sub-devices, said metal lead wires are arrayed alternating from left and right sides to center according to an order of said sub-devices in said sub-device group.

5. The integrated circuit of claim 1, wherein when said main-device is formed by 4×K series connected said sub-devices, said integrated circuit further comprises metal connecting wires arrayed in a different level than said metal lead wires to connect 4×K said sub-devices, and wherein common nodes of said metal lead wires and corresponding said metal connecting wires are connected by at least one via.

6. The integrated circuit of claim 1, wherein said common connecting wires are located above said sub-devices and are in a same level as said metal lead wires.

7. The integrated circuit of claim 1, wherein said devices comprise passive devices or active devices.

8. The integrated circuit of claim 1, wherein said devices comprise transistors.

9. The integrated circuit of claim 8, wherein said transistors are configured in a current mirror circuit.

10. The integrated circuit of claim 1, wherein said devices comprise resistors.

11. The integrated circuit of claim 10, wherein said resistors are configured in a multi-channel light-emitting diode (LED) driver.

12. The integrated circuit of claim 1, wherein said devices comprise capacitors.

13. The integrated circuit of claim 1, wherein said devices comprise inductors.

14. The integrated circuit of claim 1, wherein said devices comprise diodes.

* * * * *